United States Patent
Sakai et al.

[11] Patent Number: 6,038,461
[45] Date of Patent: Mar. 14, 2000

[54] PLASTICALLY DEFORMABLE HIGH TEMPERATURE SUPERCONDUCTIVE MATERIAL AND METHOD OF MANUFACTURING FORMED BODY THEREOF

[76] Inventors: Yoshifumi Sakai; Itsuko Sakai, both of 16-3, Showa 4-chome, Chiryu-shi, Aichi-ken, Japan

[21] Appl. No.: 09/066,261

[22] Filed: Apr. 24, 1998

[30] Foreign Application Priority Data

May 19, 1997 [JP] Japan ..................... 9-128911

[51] Int. Cl.$^7$ ............... B22F 3/12; B32B 15/04
[52] U.S. Cl. ............ 505/230; 505/124; 505/125; 505/236; 505/704; 505/777; 505/778; 505/422; 505/433; 505/434; 505/823; 419/3; 419/10; 419/28; 419/48; 419/49; 419/57; 419/60
[58] Field of Search ................. 419/3, 10, 28, 419/48, 49, 57, 60; 505/124, 125, 230, 236, 704, 777, 778, 422, 433, 434, 823

[56] References Cited

U.S. PATENT DOCUMENTS 4,746,373  5/1988  Yamada et al. ................ 148/11.5 P Primary Examiner—Daniel J. Jenkins

[57] ABSTRACT

There are disclosed a high temperature superconductive material which can be plastically deformed, processed optionally into predetermined configurations and industrially mass produced and a method of manufacturing a formed body of the high temperature superconductive material. Mixed is a powder raw material which is mainly composed of: 10 to 50 mol % of at least one amide or nitride of alkali metal of Li, Na or K; 10 to 60 mol % of cyanide containing at least one metal selected from aluminum, copper, silver or gold; 5 to 50 mol % of at least one pure metal selected from aluminum, copper, silver or gold; and 10 mol % or less of at least one alkaline earth metal selected from Be, Mg, Ca, Sr or Ba. The powder raw material is pressed, and heated and sintered at the temperature of 673 K to 1553 K. In this manner, obtained is the plastically deformable high temperature superconductive material which can be optionally processed through forging, rolling and the like. Also, the obtained high temperature superconductive material has a critical temperature of 40 K to 80 K and a current density of 10000 A/cm$^2$ or more.

5 Claims, 3 Drawing Sheets

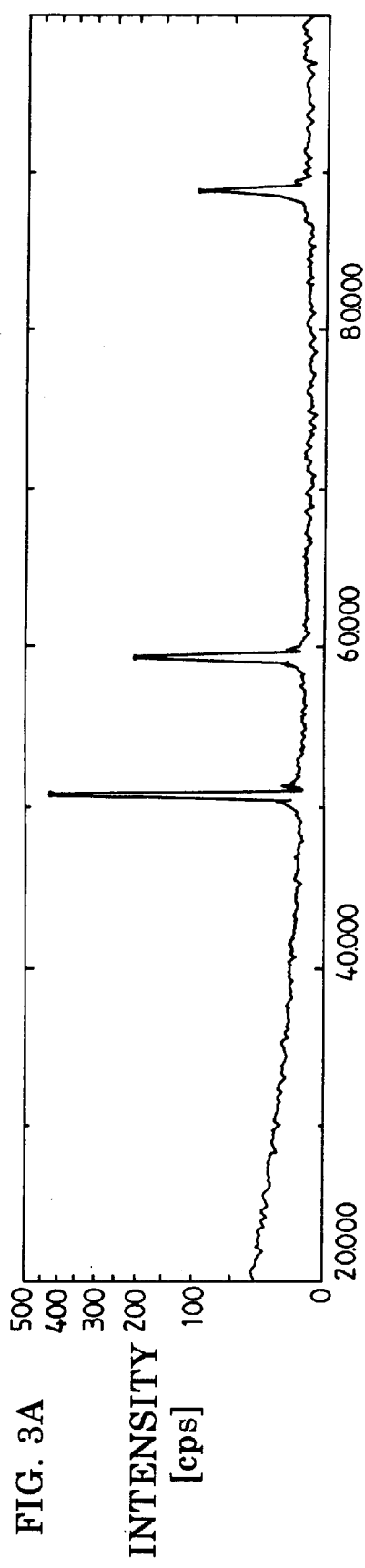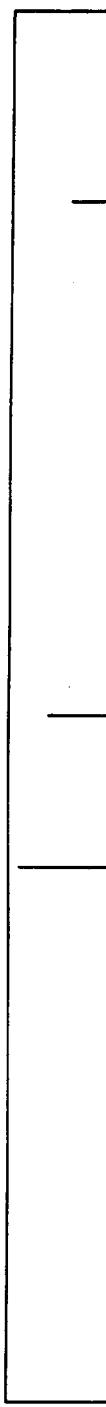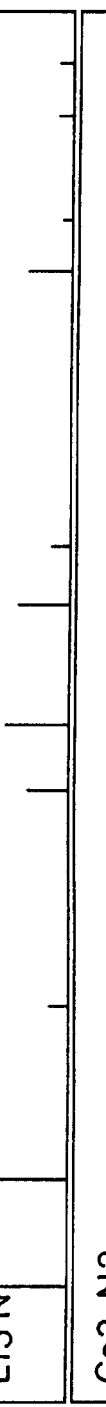
FIG. 3A
FIG. 3B
FIG. 3C Cu
FIG. 3D CuCN
FIG. 3E Li3N
FIG. 3F Ca3N2

PLASTICALLY DEFORMABLE HIGH TEMPERATURE SUPERCONDUCTIVE MATERIAL AND METHOD OF MANUFACTURING FORMED BODY THEREOF

BACKGROUND OF THE INVENTION

1. Field of The Invention

The present invention relates to a high temperature superconductive material and a method of manufacturing a formed body of the material.

The high temperature superconductive material is formed into a predetermined configuration through rolling, forging, drawing, extruding or another processing, and can broadly be applied to an electric power, energy or electronic apparatus and other fields. The invention especially relates to a high temperature superconductive material suitable for a linear motor car, a high-speed computer, a magnet, an electricity generator, an electric motor, power supply, power storage and the like and to a method of manufacturing a formed body of the high temperature superconductive material.

2. Prior Art

A superconductive phenomenon was discovered in the beginning of the $20^{th}$ century, and an oxide superconductor, with which a superconductive phenomenon could occur at a high temperature of 30 K, was found in 1986. Since then a superconductor field has been enlarged.

However, the oxide superconductor is not plastically deformable, and has a bad workability. By bending the oxide superconductor only once, it is broken. Even if the oxide superconductor can be bent successfully, it is instantly broken after the bent portion is slightly straightened. Therefore, the oxide superconductor cannot be processed into a coil or the like. Such property is still a disturbance to the practical use of the oxide superconductor. Therefore, researchers in the world have been devoted to improving and researching the oxide superconductor.

Since it is very difficult to process a formed body of such oxide superconductor, coils or the like cannot be industrially mass produced. The oxide superconductor cannot be used in various applications.

SUMMARY OF THE INVENTION

Wherefore, an object of the invention is to provide a plastically deformable high temperature superconductive material which can be optionally processed into a predetermined configuration and can be industrially mass produced and to provide a method of manufacturing a formed body of the high temperature superconductive material.

To attain this and other objects, the invention provides a plastically deformable high temperature superconductive material made of a powder raw material. The powder raw material is mainly composed of 10 to 50 mol % of at least one amide or nitride of an alkali metal selected from Li, Na or K; 10 to 60 mol % of cyanide containing at least one metal selected from aluminum, copper, silver or gold; 5 to 50 mol % of at least one pure metal selected from aluminum, copper, silver or gold; and 10 mol % or less of at least one alkaline earth metal selected from Be, Mg, Ca, Sr or Ba. The powder raw material is mixed and sintered under pressure to form the plastically deformable high temperature superconductive material.

According to the invention, at the time of sintering, at least one amide compound of the alkali metal selected from Li, Na or K is heated and pyrolytically decomposed to form ammonia and the nitride of alkali metal. Ammonia is combined with the cyanide of aluminum, copper, silver or gold to form a stable ammine complex. On the other hand, the nitride of the alkali metal is combined with the pure metal of aluminum, copper, silver or gold to form a sintered material composed of metal-compound and metal.

As a result, since the ammine complex and the sintered material composed of metal-compound and metal formed at the time of the sintering under pressure provide a good plastic workability, various predetermined configurations such as linear materials, plate materials, tubular materials or the like can be processed. Additionally, electrons can pass with a minimum electric resistance through the electrically stable ammine complex and the sintered material composed of metal-compound and metal.

Here, the content of the amide is 10 to 50 mol %. If the content is less than 10 mol %, the quantity of ammonia generated as a decomposition product of the amide compound is excessively small. Therefore, a sufficient quantity of ammine complex cannot be prepared. On the other hand, if the content exceeds 50 mol %, the quantity of ammonia is excessively large. Then, blow holes are made in the formed body.

Additionally, the content of cyanide is 10 to 60 mol %. The content less than 10 mol % is insufficient for preparing ammine complex. On the other hand, the content exceeding 60 mol % is more than necessary for preparing ammine complex. The cyanide is left as it is. Then, the electric resistance is increased.

Further, the content of the pure metal is 5 to 50 mol %. If the content is less than 5 mol %, the quantity of the pure metal is excessively small for forming the sintered material composed of metal-compound and metal. Then, the electric resistance is increased. On the other hand, if the content exceeds 50 mol %, the physical properties of the metal are exhibited too much. Even if cooling is performed in any manner, the electric resistance is inhibited from decreasing.

Additionally, the content of the alkaline earth metal is 10 mol % or less. If the content exceeds 10 mol %, an excess quantity of nitride thereof is generated. Then, the electric resistance increases.

As aforementioned, the ammine complex and the sintered material composed of metal-compound and metal can be plastically deformed and optionally processed. Also, electrons can pass with a minimum electric resistance through the electrically stable ammine complex and the sintered material composed of metal-compound and metal.

Also, the invention provides a method of manufacturing a formed body of a plastically deformable high temperature superconductive material formed of a powder raw material. The powder raw material is mainly composed of 10 to 50 mol % of at least one amide or nitride of alkali metal selected from Li, Na or K; 10 to 60 mol % of cyanide containing at least one metal selected from aluminum, copper, silver or gold; 5 to 50 mol % of at least one pure metal selected from aluminum, copper, silver or gold; and 10 mol % or less of at least one alkaline earth metal selected from Be, Mg, Ca, Sr or Ba. The powder raw material is stirred in inert gas atmosphere, mashed and uniformly mixed. Subsequently, a metal capsule is filled with the powder raw material. By pressing and heating the metal capsule in a vacuum or in an inert gas atmosphere, the raw material is sintered.

According to the invention, the powder raw material is stirred in the inert gas atmosphere, mashed and mixed to form the powder raw material with a uniform composition.

In the process, the powder raw material is not oxidized. Also, after filling the capsule with the powder raw material, the capsule is heated and sintered under pressure in a furnace in the non-oxidizing vacuum or the inert gas atmosphere. At this time, the stable ammine complex and the sintered material composed of metal-compound and metal are formed. Since the ammine complex and the sintered material composed of metal-compound and metal are superior in plastic workability, they can be processed into various configurations.

In the method of manufacturing the formed body of the plastically deformable high temperature superconductive material, the sintering is performed by heating the metal capsule in the inert gas atmosphere in a range of temperatures from 673 K to 1553 K for a period of time from 0.5 to three hours.

According to the invention, the sintering under pressure is performed in the range of temperatures from 673 K to 1553 K. Therefore, more stable ammine complex and sintered material composed of metal-compound and metal can be obtained.

Here, the temperature range in which the superconductive material is sintered under pressure is from 673 K to 1553 K. If the temperature is less than 673 K, no ammine complex is generated. Additionally, at 1553 K a sufficiently stable ammine complex can be obtained. The temperature does not need to be higher than 1553 K.

The period of time for heating is set from 0.5 to three hours. Within 0.5 hour, a uniform heat cannot be obtained for the superconductive material. On the other hand, when heating is performed for three hours, a sufficiently uniform heat can be obtained. Then, more heat is unnecessary.

In the method of manufacturing the formed body of the plastically deformable high temperature superconductive material, the formed body which was sintered under pressure is further rolled, forged, drawn or extruded to form a predetermined configuration.

According to the invention, since the high temperature superconductive material having the ammine complex and the sintered material composed of metal-compound and metal is used, linear materials, plate materials, tubular materials or other formed bodies can be industrially mass produced optionally.

In the method of manufacturing the formed body of the plastically deformable high temperature superconductive material, a stainless steel capsule or a copper capsule is used as the metal capsule. After the capsule is filled with the powder raw material and sintered, by rolling, forging, drawing or extruding the capsule, a coating layer of stainless steel or copper is formed on a surface of the high temperature superconductive material.

According to the invention, since the material and the capsule are processed together with the material put in the capsule, a good yield is provided. Additionally, boundary surfaces of the coating layer and the high temperature superconductive formed body closely contact to each other through processing, and are prevented from peeling off during processing and operation. Further, since the coating layer of a soft material, e.g., stainless steel or copper is formed on the surface, the high temperature superconductive material can be easily wound like a coil configuration. The surface of the layer is thus durable. The coating layer serves as a protective layer for the metal which is easily oxidized in the atmosphere, and as a shielding material for the metal which easily reacts with moisture in the atmosphere.

BRIEF DESCRIPTION OF THE DRAWINGS

FIGS. 3A to 3F are explanatory views showing results of an X-ray analysis in the embodiment.

DETAILED DESCRIPTION OF THE PREFERRED EMBODIMENTS

An embodiment will be described with reference to the accompanying drawings. In the embodiment there is provided a high temperature superconductive material which is plastically deformable, can be freely processed in a predetermined configuration and which can be industrially mass-produced. There is also provided a method of manufacturing a formed body of the high temperature superconductive material.

Figure 1:
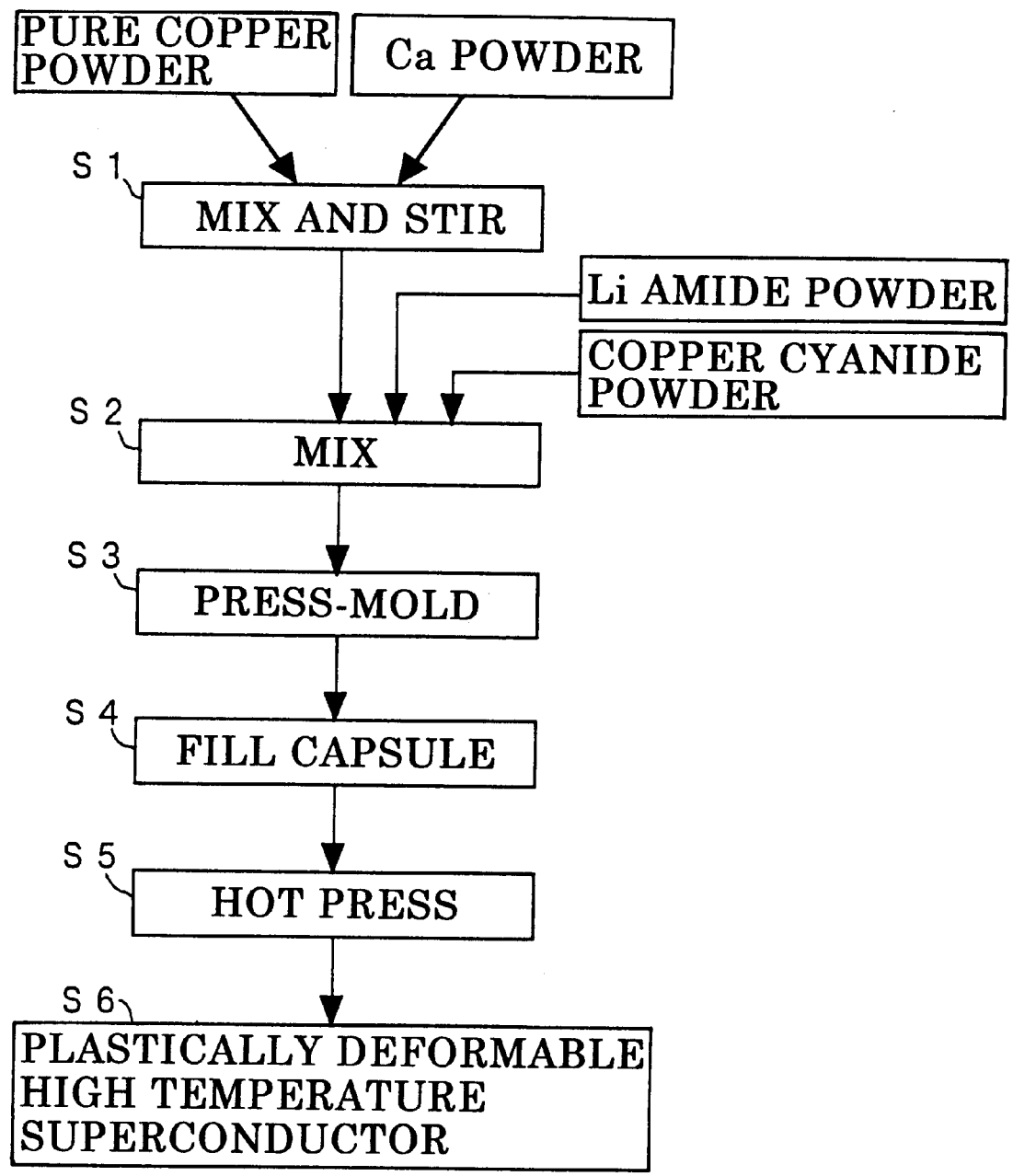
FIG. 1 is a flowchart showing a method of manufacturing a plastically deformable high temperature superconductive material according to an embodiment of the invention.

In the method, as shown in FIG. 1, at step S1 19.8 mol % of pure copper powder mashed to 200 mesh or less and 1 mol % of Ca powder finely ground in an argon gas atmosphere are mixed and stirred in a mortar in the argon gas atmosphere. Subsequently at step S2, 29.7 mol % of Li amide powder and 49.5 mol % of copper cyanide powder are also placed in the mortar and stirred for 15 hours by using a stirring mixer in the argon gas atmosphere. These powder raw materials are uniformly intermixed. Subsequently, at step S3 the mixed powder is pressed in the argon gas atmosphere under the pressure of 2000 MPa to form a block which has a configuration matched with an inner configuration of a capsule. At step S4 the capsule of stainless steel is filled with the block. The capsule is deaerated and sealed. At step S5 the capsule with the block held therein is transferred into a hot press chamber, in which the capsule is pressed under the pressure of 50 to 250 MPa, preferably 150 MPa and sintered in the argon gas atmosphere at a temperature of 673 K to 1553 K, preferably 1423 K for 0.5 to three hours, preferably three hours. Finally, a sintered body of plastically deformable high temperature superconductor is obtained at step S6.

In the method, at the time of sintering, ammine complex and sintered material composed of metal-compound and metal are formed. The sintered body is plastically deformable, and can be freely processed into a predetermined configuration. Also, electrons can pass with a minimum electric resistance through the electrically stable ammine complex and the sintered material composed of metal-compound and metal.

Additionally, the ammine complex has a chemical composition of, for example, $Cu_4(NH_3)_2(CN)_4$, and makes up 47.6 mol % of the entire sintered body.

Figure 2:
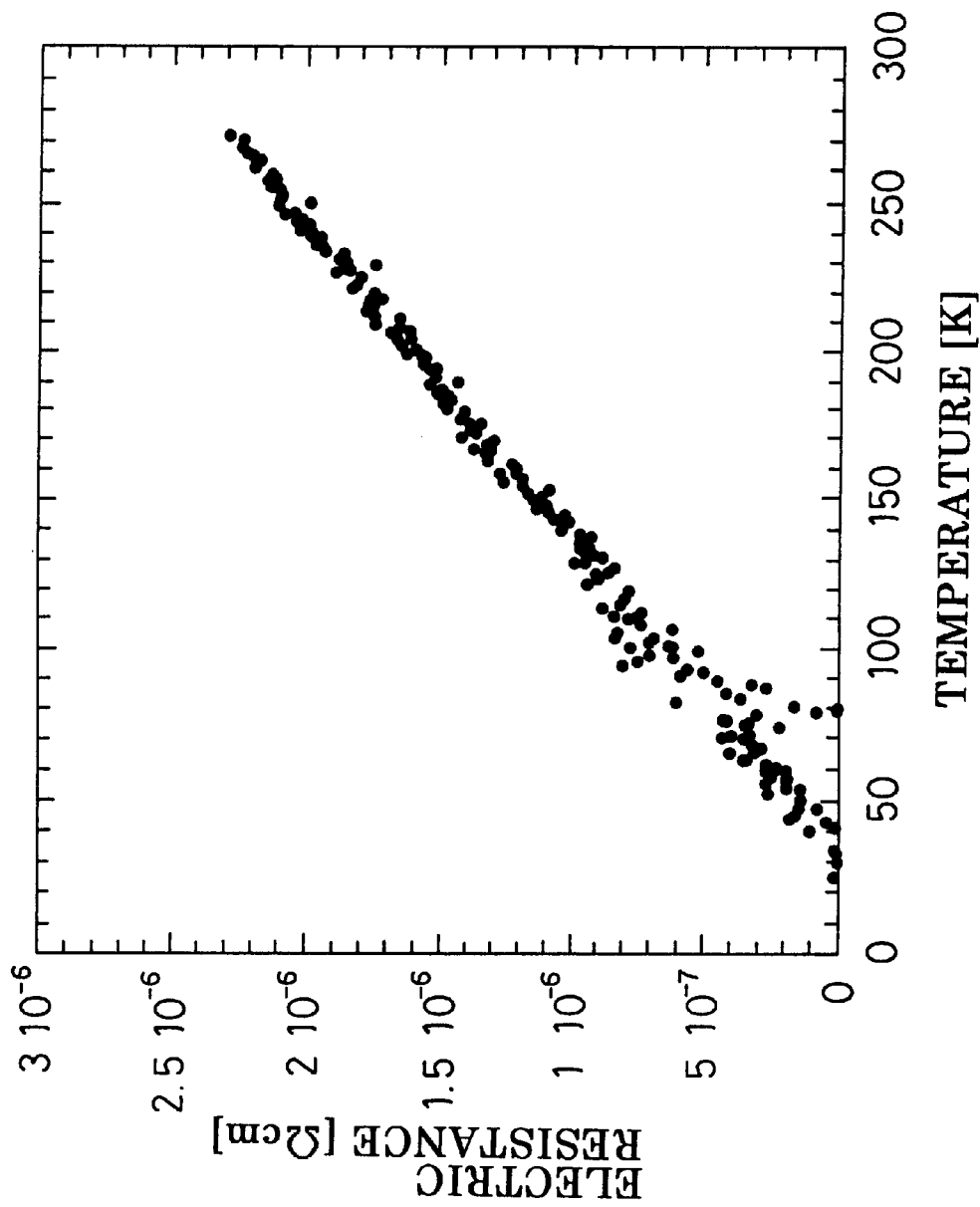
FIG. 2 is an explanatory view showing the electric resistance of a sintered body in the embodiment.

Measurement results of the electric resistance of the sintered body are shown in FIG. 2. In the measurement, a 0.144 cm wide, 0.099 cm thick and 2.33 cm long test piece was used. The test piece was gradually cooled from a room temperature. By applying an electric current of 10 mA to the test piece, the electric resistance was sequentially measured.

As a result, the electric resistance of 0 $\Omega$ cm was indicated at the temperature of 40 K, and further a value close to 0 $\Omega$ cm was indicated at the temperature of 80 K. Additionally, by slightly reducing the blending ratio of the cyanide, 80 K or higher critical temperature can be obtained.

In the same manner as the aforementioned sintered body, a 0.02 cm wide, 0.025 cm thick and 2.0 cm long test piece was prepared. When an electric current of 5 A was supplied, the test piece was normal without generating heat. At this time, the current density was 10000 $A/cm^2$.

Further, a coating layer or capsule layer was scraped from the sintered body. Then, the sintered body was forged with a press or a hammer, and bent or straightened. However, no crack was made on surfaces and inner faces of the formed body of the high temperature superconductive material. The sound formed body was obtained. For the appearance of the formed body, it had a copper color and a specific weight of 8.2. Consequently, linear materials, plate materials, tubular materials or other formed bodies can be industrially mass-produced optionally.

Additionally, the sintered body covered with the stainless steel capsule was forged with a press or a hammer, then bent or straightened. A sound high temperature superconductive formed body with no crack could be obtained. In this case, the processing is performed with the sintered body put in the capsule. Therefore, a good yield can be provided. Additionally, the boundary surfaces of the coating layer and the superconductive material closely contact to each other through the processing. Therefore, these are not peeled off from each other during processing and operation. Further, the coating layer of a soft stainless steel is formed on the surface of the sintered body. Therefore, the sintered body can be wound like a coil configuration. The surface is durable. The coating layer also protects the metal liable to be oxidized in the high temperature superconductive material from the atmosphere, and further shields the metal liable to react with moisture from the atmosphere.

Qualitative values as X-ray analysis data of the sintered body prepared in the aforementioned processes will be described with reference to FIG. 3.

FIG. 3A shows X-ray intensities; FIG. 3B shows X-ray peaks; FIG. 3C shows the state in which copper is detected; FIG. 3D shows the state in which CuCN is detected; FIG. 3E shows the state in which $Li_3N$ is detected; and FIG. 3F shows the state in which $Ca_3N_2$ is detected. Here, large waveforms which appear among small waveforms indicative of X-ray intensities completely coincide with waveforms indicative of peak data and waveforms of copper. It is indicated that copper is a main component. Although it is not shown, in FIG. 3A, by large peaks, it can be seen from the positions of small peaks that other components such as CuCN, $Li_3N$ and $Ca_3N_2$ are included as well.

According to the embodiments, the high temperature superconductor sintered body can be freely processed through forging, rolling, drawing, extruding and the like. Additionally, since the sintered body can be easily formed in a linear, plate, tubular, annular or another predetermined configuration, it can be practically used in various broad fields.

An innovation is brought especially in a linear motor car, a high-speed computer, a magnet, an electricity generator, an electric motor, power supply, power storage or the like. Then, great innovation and improvement are established in an electric power or energy field or an electric or electronic field.

While the preferred embodiment of the invention has been described, it is to be understood that the invention is not limited thereto, and may be otherwise embodied within the scope of the following claims.

For example, in the embodiment, pure copper powder is used as the pure metal. Even if pure aluminum powder, pure silver powder or pure gold powder is used, the same effect can be obtained as the pure copper powder. Also in the embodiment, Ca powder is used as the alkaline earth metal. Even if Be powder, Mg powder, Sr powder or Ba powder is used, the same effect can be obtained as the Ca powder. Further in the embodiment, Li amide powder is used as the amide. Even if Na amide powder or K amide powder is used, the same effect can be obtained as the Li amide powder. Also in the embodiment, copper cyanide powder is used as the cyanide. Even if silver cyanide powder or gold cyanide powder is used instead, the same effect can be obtained as the copper cyanide powder.

Additionally, in the embodiment, after the pure copper powder and the Ca powder are mixed and stirred in the inert gas, the Li amide powder and the copper cyanide powder are mixed in the inert gas. Alternatively, these powder materials can be mixed and stirred altogether in the inert gas.

Further in the embodiment, the stainless steel capsule is used as the metal capsule. Even the use of a copper capsule has the same effect as the stainless steel capsule.

Also in the embodiment, the high temperature superconductive material is sintered with a hot press. Alternatively, the burning can be performed with hot isostatic press (HIP).

What is claimed is:

1. A plastically deformable high temperature superconductive material which comprises a powder raw material mainly composed of:

10 to 50 mol % of at least one amide or nitride of alkali metal selected from the group consisting of Li, Na and K;

10 to 60 mol % of cyanide containing at least one metal selected from the group consisting of aluminum, copper, silver and gold;

5 to 50 mol % of at least one pure metal selected from the group consisting of aluminum, copper, silver and gold; and 10 mol % or less of at least one alkaline earth metal selected from the group consisting of Be, Mg, Ca, Sr and Ba;

said plastically deformable high temperature superconductive material being manufactured by mixing and sintering under pressure said powder raw material.

2. A method of manufacturing a formed body of a plastically deformable high temperature superconductive material comprising a powder raw material mainly composed of:

10 to 50 mol % of amide or nitride of at least one alkali metal selected from the group consisting of Li, Na and K;

10 to 60 mol % of cyanide containing at least one metal selected from the group consisting of aluminum, copper, silver and gold;

5 to 50 mol % of at least one pure metal selected from the group consisting of aluminum, copper, silver and gold; and 10 mol % or less of at least one alkaline earth metal selected from the group consisting of Be, Mg, Ca, Sr and Ba;

said method comprising the steps of:
   stirring said powder raw material in inert gas atmosphere;
   mashing the powder raw material;
   uniformly mixing the powder raw material;
   filling a metal capsule with the powder raw material; and
   sintering the raw material by pressing and heating the metal capsule in a vacuum or in the inert gas atmosphere.

3. A method of manufacturing a formed body of a plastically deformable high temperature superconductive material according to claim 2 wherein in said sintering step, heating is performed in the inert gas atmosphere in a range of temperatures from 673 K to 1553 K and in a range of time periods from 0.5 hour to three hours.

4. A method of manufacturing a formed body of a plastically deformable high temperature superconductive material according to claim 2 wherein said formed body is shaped into a predetermined configuration by further rolling, forging, drawing or extruding said formed body.

5. A method of manufacturing a formed body of a plastically deformable high temperature superconductive material according to claim 4 wherein a capsule of stainless steel or copper is used as said metal capsule, and after the capsule is filled with said powder raw material and sintered, by rolling, forging, drawing or extruding the capsule, a coating layer of stainless steel or copper is formed on a surface of the superconductive material.

* * * * *